(12) United States Patent
Lin et al.

(10) Patent No.: US 8,912,610 B2
(45) Date of Patent: Dec. 16, 2014

(54) STRUCTURE AND METHOD FOR MOSFETS WITH HIGH-K AND METAL GATE STRUCTURE

(75) Inventors: Jr Jung Lin, Zhubei (TW); Yun-Ju Sun, Taipei (TW); Shih-Hsun Chang, Hsinchu (TW); Chia-Jen Chen, Chiayi (TW); Tomonari Yamamoto, Jhubei (TW); Chih-Wei Kuo, Tainan (TW); Meng-Yi Sun, Hsinchu (TW); Kuo-Chiang Ting, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 143 days.

(21) Appl. No.: 13/438,451

(22) Filed: Apr. 3, 2012

(65) Prior Publication Data
US 2013/0119487 A1 May 16, 2013

Related U.S. Application Data

(60) Provisional application No. 61/558,723, filed on Nov. 11, 2011.

(51) Int. Cl.
*H01L 21/70* (2006.01)
*H01L 21/02* (2006.01)
(Continued)

(52) U.S. Cl.
CPC ......... *H01L 21/0206* (2013.01); *H01L 29/7848* (2013.01); *H01L 29/6659* (2013.01); *H01L*
(Continued)

(58) Field of Classification Search
CPC ............... H01L 21/82385; H01L 27/14614; H01L 29/41775; H01L 21/28061; H01L 21/823468; H01L 21/823857; H01L 21/823864; H01L 27/0922; H01L 27/105; H01L 29/42376; H01L 21/02244; H01L 21/28008; H01L 29/47; H01L 29/4941; H01L 29/6653; H01L 29/6656; H01L 29/66621; H01L 21/768
USPC ......... 257/151–153, 249, 314–320, 331, 366, 257/387, 412, E29.125–E29.131, 257/E29.134–E29.138, E29.14–E29.161, 257/E29.275, E29.319, E21.176–E21.186, 257/E21.374, E21.458, E21.621–E21.624, 257/E21.635–E21.638, E21.634, E21.407, 257/E27.064, E21.639, E21.66, E21.689, 257/E27.081, E27.088, E21.648, E27.089, 257/E29.255, E21.409, E29.253, 192, 288, 257/296, E21.158, E21.19, E21.199, 257/E21.205, E21.312, E21.429, E21, 257/E21.444, E21.453, E21.507, E21.64, 257/E29.157, 194, 195, 200, 295, 305, 321, 257/500, E21.047, E21.2, E21.206, 257/E21.218, E21.335, E21.41, E21.435, 257/E21.439, E21.44, E21.443; 257/E21.454, E21.576, E21.619, 257/E21.626, E23.132, E29.004, E29.021, 257/E29.04, E29.041, E29.05, E29.089, 257/E29; 438/157, 176, 195, 267, 283, 438/585–596
See application file for complete search history.

(56) References Cited

U.S. PATENT DOCUMENTS 8,314,022 B1 * 11/2012 Foster et al. ................ 438/591
2007/0126067 A1 * 6/2007 Hattendorf et al. ........... 257/412
(Continued)

*Primary Examiner* — Jae Lee
*Assistant Examiner* — Junaiden Mirsalahuddin
(74) *Attorney, Agent, or Firm* — Haynes and Boonem LLP

(57) ABSTRACT

The present disclosure provides a semiconductor structure. The semiconductor structure includes a semiconductor substrate; and a gate stack disposed on the semiconductor substrate. The gate stack includes a high k dielectric material layer, a capping layer disposed on the high k dielectric material layer, and a metal layer disposed on the capping layer. The capping layer and the high k dielectric material layer have a footing structure.

16 Claims, 8 Drawing Sheets

(51) Int. Cl.
  *H01L 29/66* (2006.01)
  *H01L 21/311* (2006.01)
  *H01L 29/423* (2006.01)
  *H01L 21/3213* (2006.01)
  *H01L 21/28* (2006.01)
  *H01L 29/78* (2006.01)
  *H01L 29/51* (2006.01)

(52) U.S. Cl.
  CPC . 21/31116 (2013.01); *H01L 29/513* (2013.01); *H01L 21/31122* (2013.01); *H01L 29/42376* (2013.01); *H01L 21/02071* (2013.01); *H01L 29/517* (2013.01); *H01L 21/32136* (2013.01); *H01L 21/28114* (2013.01); *H01L 21/32137* (2013.01); *H01L 21/28088* (2013.01); *H01L 29/66545* (2013.01)
  USPC ......................................................... 257/407

(56) References Cited

U.S. PATENT DOCUMENTS

| | | |
|---|---|---|
| 2010/0062590 A1 | 3/2010 | Lin et al. |
| 2011/0195549 A1* | 8/2011 | Chuang et al. ............... 438/216 |
| 2012/0146160 A1* | 6/2012 | Tan et al. .................... 257/412 |

* cited by examiner

STRUCTURE AND METHOD FOR MOSFETS WITH HIGH-K AND METAL GATE STRUCTURE

PRIORITY DATA

The present application claims priority to U.S. Provisional Patent Application Ser. No. 61/558,723, filed Nov. 11, 2011, the disclosure of which is incorporated herein by reference in its entirety.

BACKGROUND

In advanced technology nodes of integrated circuit industry, high k dielectric material and metal are adopted to form a gate stack of a field-effect transistor (FET) such as a metal-oxide-semiconductor field-effect transistors (MOSFETs). In the existing method to pattern the metal gate stack, due the film uniformity, the work function of a metal layer in the metal gate stack is shifted toward the mid-gap at the gate edge. Accordingly, the threshold voltage is unexpectedly changed, leading to poor short channel control at the constant sub-threshold leakage current. Additionally, the drive current is degraded due to the increase of source drain extension resistance. Furthermore, the poor uniformity of the metal films in the existing method leads to the worsen work function variation within the gate. Therefore, a structure of a metal gate stack and a method making the same are needed to address the issues identified above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
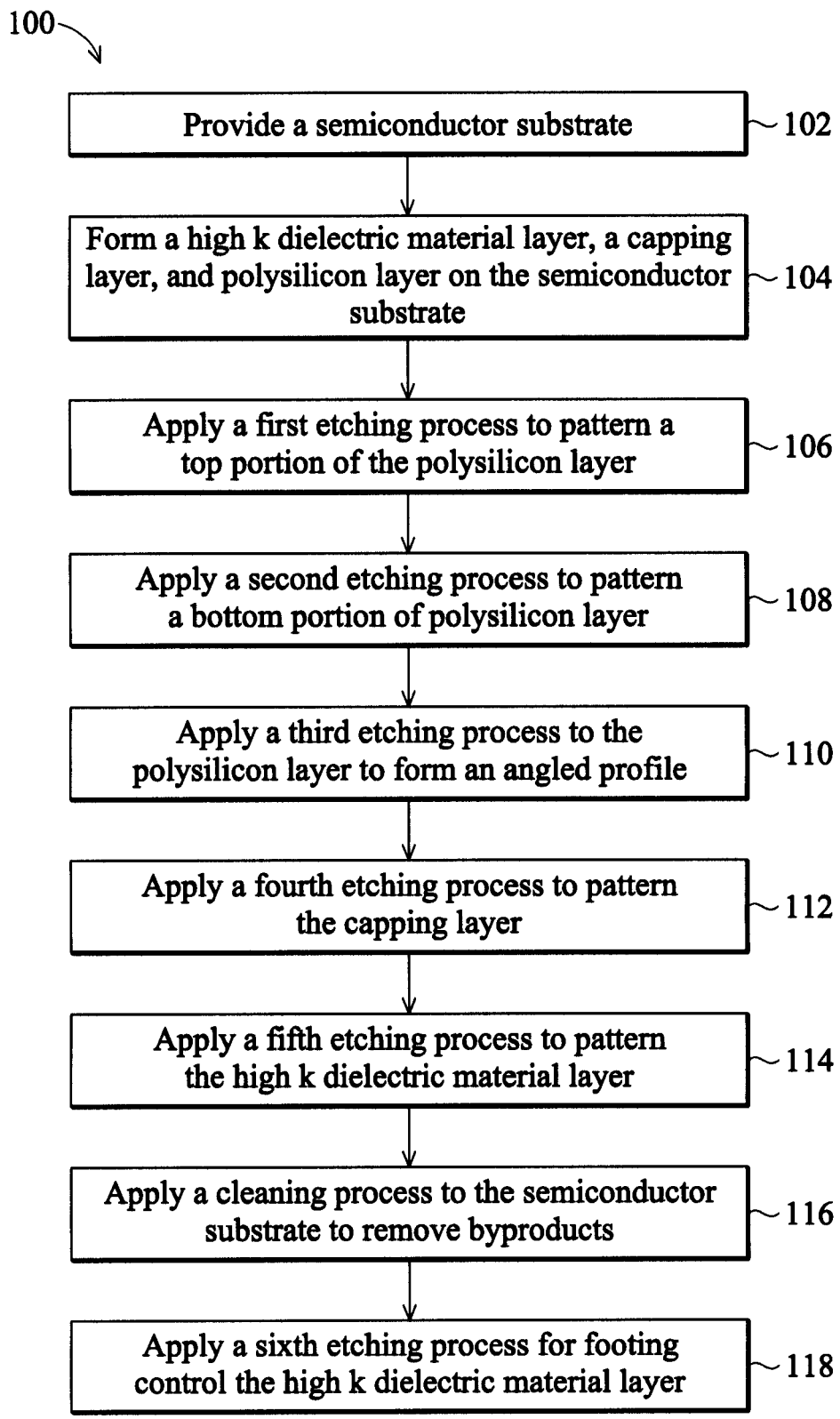
FIG. 1 is a flowchart of a method for making a semiconductor device having a metal gate stack in one embodiment constructed according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 2:
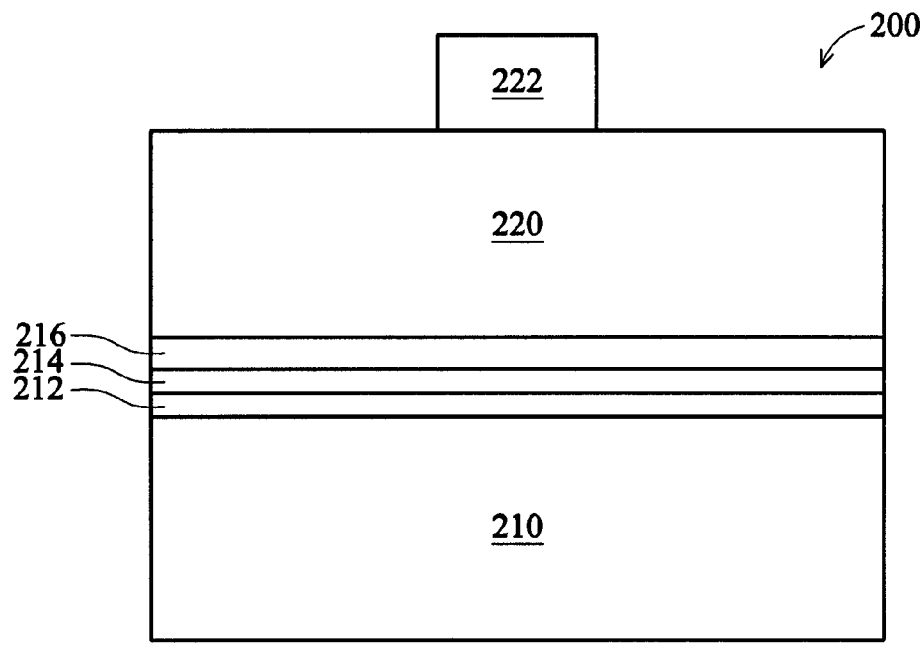
FIGS. 2-4, 5A, and 6-7 are sectional views of one embodiment of a semiconductor device having a metal gate stack at various fabrication stages constructed according to various aspects of the present disclosure.

FIG. 1 is a flowchart of one embodiment of a method 100 making a semiconductor device having a gate stack constructed according to aspects of the present disclosure. FIGS. 2 and 7 are sectional views of one embodiment of a semiconductor structure 200 having a gate stack at various fabrication stages. The semiconductor structure 200 and the method 100 of making the same are collectively described with reference to FIGS. 1 through 7

The method 100 begins at step 102 by providing a semiconductor substrate 210. The semiconductor substrate 210 includes silicon. Alternatively, the substrate 210 includes germanium or silicon germanium. In other embodiments, the substrate 210 may use another semiconductor material such as diamond, silicon carbide, gallium arsenic, GaAsP, AlInAs, AlGaAs, GaInP, or other proper combination thereof.

The semiconductor substrate also includes various doped regions such as n-well and p-wells formed by a proper technique, such as ion implantation. The semiconductor substrate 210 also includes various isolation features, such as shallow trench isolation (STI), formed in the substrate to separate various devices. The formation of the STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, and using chemical mechanical planarization (CMP) to polish and planarize.

Referring to FIG. 2, the method 100 proceeds to step 104 by forming various metal-gate-stack material layers on the semiconductor substrate 210. In one embodiment, a high k dielectric material layer 214 is formed on the semiconductor substrate 210. A capping layer 216 is formed on the high k dielectric material layer 214. A polysilicon layer 220 is formed on the capping layer 216. An interfacial layer (IL) 212 may be interposed between the semiconductor substrate 210 and the high k dielectric material layer 214.

The interfacial layer 212 is formed on the silicon substrate 210 before forming the high k dielectric material layer 214. The interfacial layer 212 may include silicon oxide formed by a proper technique, such as an atomic layer deposition (ALD), thermal oxidation or UV-Ozone Oxidation. The interfacial layer 212 may have a thickness less than 10 angstrom.

The high-k dielectric layer 214 includes a dielectric material having the dielectric constant higher than that of thermal silicon oxide, about 3.9. The high k dielectric material layer 214 is formed by a suitable process such as ALD. Other methods to form the high k dielectric material layer include metal organic chemical vapor deposition (MOCVD), physical vapor deposition (PVD), UV-Ozone Oxidation or molecular beam epitaxy (MBE). In one embodiment, the high k dielectric material includes HfO2. Alternatively, the high k dielectric material layer includes metal nitrides, metal silicates or other metal oxides.

The capping layer 216 is formed on the high k dielectric material layer 214. In one embodiment, the capping layer 216 includes titanium nitride (TiN). In another example, the thickness of the titanium nitride layer ranges between about 5 angstrom and about 20 angstrom. The capping layer 216 may alternatively or additionally include other suitable materials. The capping layer 216 is formed by a proper technique, such as PVD.

The polysilicon layer 220 is formed on the capping layer 216. The polysilicon layer 220 is formed by a proper technique, such as CVD. In one example, the polysilcion layer 220 is non-doped. In another example, the polysilicon layer 220 has a thickness between about 500 angstrom and about 1000 angstrom.

A patterned mask 222 is formed on the multiple metal-gate-stack layers and is used as a mask to form metal gates. The patterned mask 222 is formed on the polysilicon layer 220 as illustrated in FIG. 2. The patterned mask 222 defines various gate regions and various openings exposing the gate stack material layers to be removed. The patterned mask 222 includes a hard mask, such as silicon nitride and/or silicon oxide, or alternatively photoresist.

In one embodiment, the patterned mask layer 222 includes a patterned hard mask layer with silicon nitride and silicon oxide. As one example, a silicon nitride layer is deposited on the polysilicon layer by a low pressure chemical vapor deposition (LPCVD) process. The precursor including dichlorosilane (DCS or SiH2Cl2), bis(TertiaryButylAmino)silane (BTBAS or C8H22N2Si) and disilane (DS or Si2H6) is used in the CVD process to form the silicon nitride layer. A silicon oxide layer is formed on the silicon nitride layer by a proper technique, such as CVD using a precursors including hexachlorodisilane (HCD or Si2Cl6), dichlorosilane (DCS or SiH2Cl2), Bis(TertiaryButylAmino)Silane (BTBAS or C8H22N2Si) and disilane (DS or Si2H6). The silicon nitride and silicon oxide layers are further patterned using a photolithography process to form a patterned photoresist layer and an etching process to etch the silicon oxide and silicon nitride within the openings of the patterned photoresist layer. Alternatively, other dielectric material may be used as the patterned hard mask. For example, silicon oxynitride may be used as the hard mask.

In another embodiment, the patterned mask layer 222 include a patterned photoresist layer formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper methods such as maskless photolithography, electron-beam writing, ion-beam writing, and molecular imprint.

The method includes patterning the polysilicon layer 220. In one embodiment, the dry etching process implements a fluorine-containing plasma to etch the polysilicon. For example, the etch gas includes CF4 and Cl2. In one particular example, the gas ratio between Cl2 and CF4 ranges between about 0.1 and about 0.8. In another example, the gas pressure ranges between about 1 mTorr and about 30 mTorr. In another example, the bias power ranges between about 5 W and about 300 W. In yet another example, the etching temperature (the substrate temperature during the corresponding etching process) ranges between about 10 C and about 70 C.

In the present embodiment, the polysilicon etch includes two steps respectively fine-tuned in consideration of material and process integration. Particularly, the first step is tuned to more effectively etch silicon oxide and the second step is tuned to etch without damage to the capping layer. The procedure of the two step to etch the polysilicon layer 220 is further described below.

Figure 3:
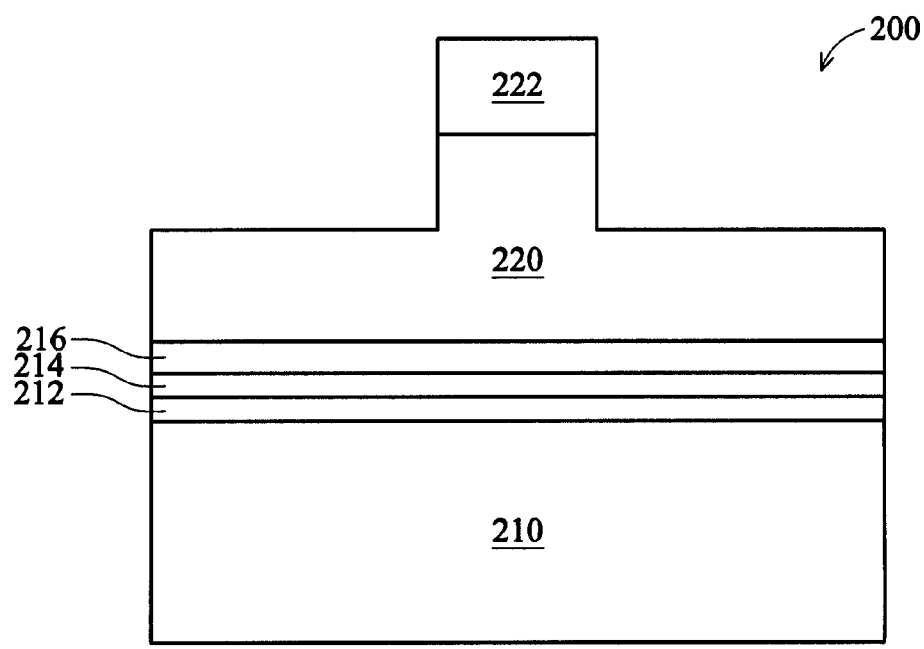

Referring to FIG. 3, the method proceeds to step 106 to pattern a top portion of the polysilicon layer 220 by applying a first etching process, using the patterned mask 222 as an etch mask. The top portion of polysilicon layer within the openings of the patterned mask 222 are removed by the first etching process. In one example, the first etch process is tuned to effectively remove silicon oxide. In another example, the top portion of the polysilicon layer 220 includes a thickness ranging between about 50 angstrom and about 600 angstrom.

Figure 4:
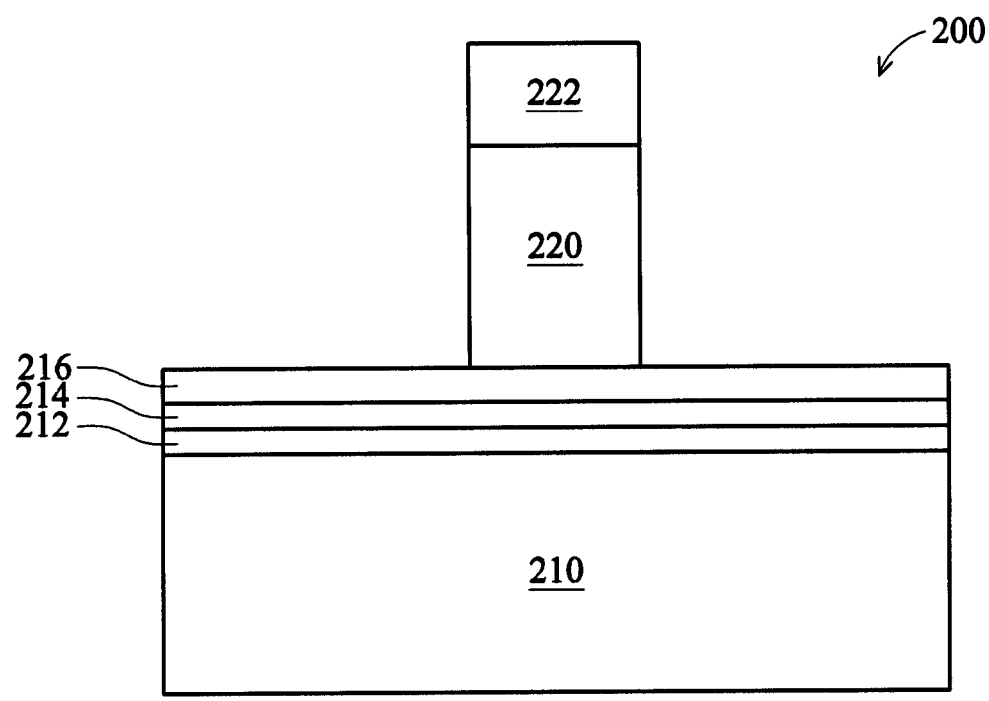

Referring to FIG. 4, the method proceeds to step 108 to pattern a bottom portion of the polysilicon layer 220 by applying a second etching process, using the patterned mask 222 as an etch mask. The bottom portion of polysilicon layer within the openings of the patterned mask 222 are removed by the second etching process. In one example, the second etch process is tuned to avoid the damage to the capping layer 216. In one particular example, the bias power of the second etch process is tuned to be less than the bias power of the first etch process.

Figure 5A:
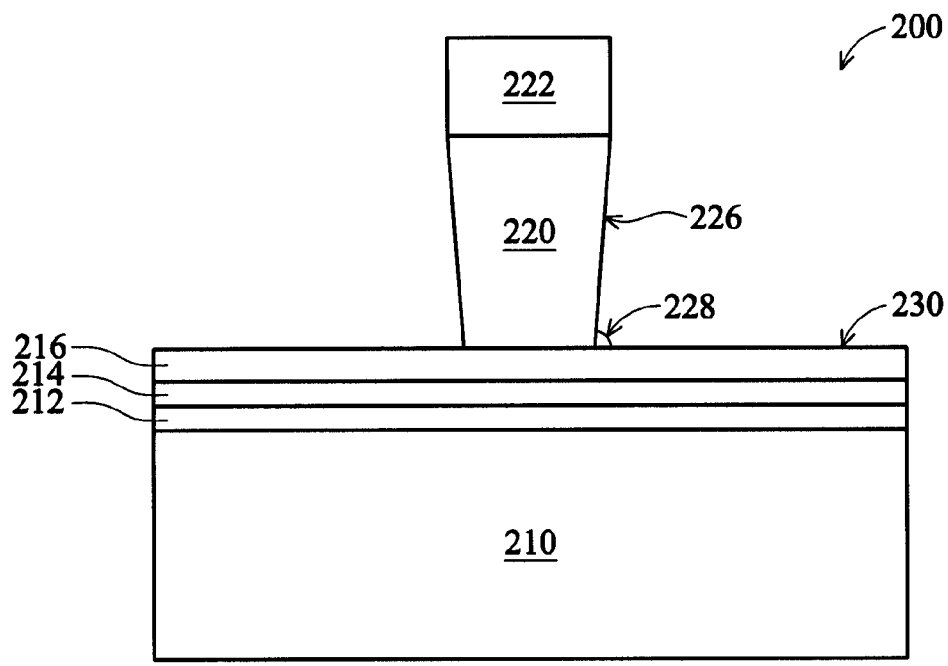
Figure 5B:
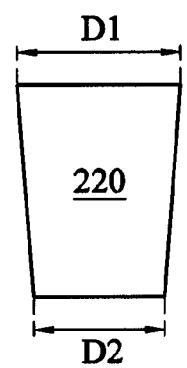
FIG. 5B is a sectional view of one embodiment of the polysilicon layer in the semiconductor device of FIG. 5A constructed according to various aspects of the present disclosure.

Referring to FIGS. 5A and 5B, the method proceeds to step 110 to form an angled sidewall profile of the polysilicon layer 220 by applying a third etch process. The third etch process is designed to have more lateral etching to control the sidewall of the polysilicon layer 220 such that the sidewall of the polysilicon layer 220 is angled inward when approaching to the bottom of the polysilicon layer, or reentrant. The sidewall 226 of the polysilicon layer 220 is not perpendicular to the substrate but has an angle 228 to the substrate surface or the top surface 230 of the capping layer 216, as illustrated in FIG. 5A. The angle 228 is less than 90 degree. In one example, the angle 228 of the sidewall 226 ranges between about 85 degree and about 90 degree.

The patterned polysilicon layer 220 is further illustrated in FIG. 5B in a sectional view. The patterned polysilicon layer 220 has different dimension at top and at bottom in a direction along the direction of the current in the channel from source to drain. Particularly, the patterned polysilicon layer 220 has a first dimension D1 at the top surface and a second dimension D2 at the bottom surface. D1 is greater than D2.

The third etch process is a dry etching process using HBr containing precursor to control the sidewall profile of the polysilicon layer 220. In one embodiment, the bias power of the third etch process is less than the bias power of the first etch process and the bias power of the second etch process. In another embodiment, the gas pressure of the third etch process is greater than the gas pressure of the first etch process and the gas pressure of the second etch process. In one example, the etch gas includes HBr with a gas flow ranging between about 10 sccm and about 200 sccm. In another example, the etch gas further includes CF4 and argon, such as about 40% CF4 and about 60% argon, for protection to avoid damage to the capping layer and/or avoid other damage. In another example, the gas pressure ranges between about 2 mTorr and about 50 mTorr. In yet another example, the bias power ranges between about 5 W and about 300 W. In yet another example, the etching temperature ranges between about 10 C and about 70 C. In yet another example, the etching duration of the third etch process ranges between about 15 second and about 100 second.

Figure 6:
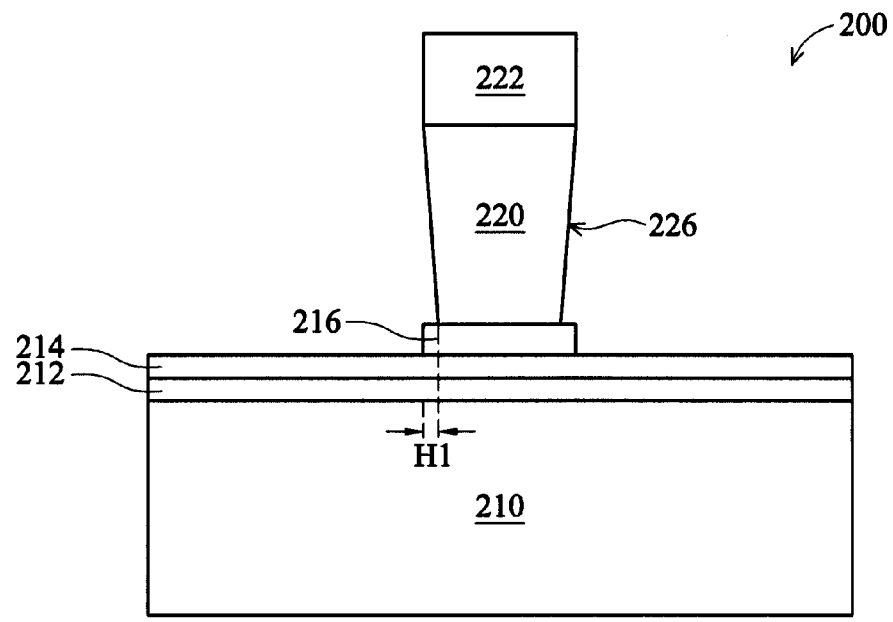
Figure 7:
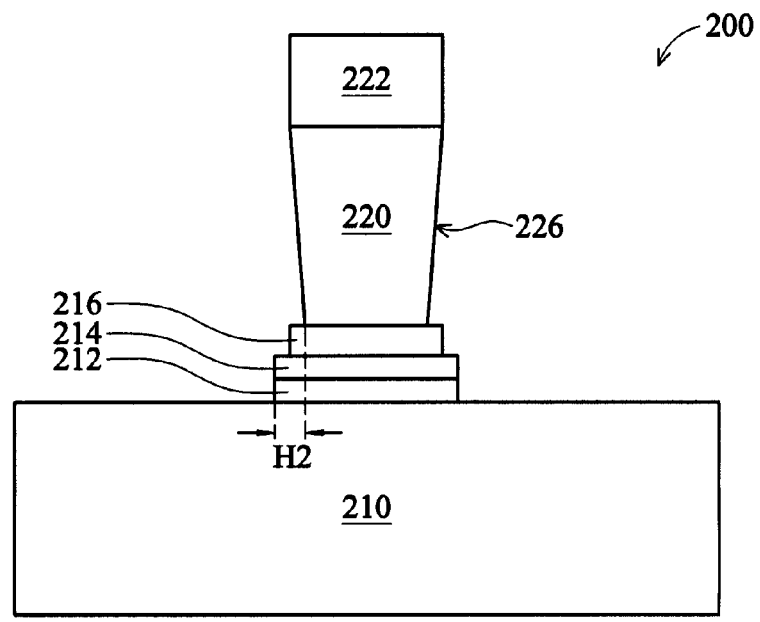

Referring to FIG. 6, the method 100 proceeds to step 112 to pattern the capping layer 216 by applying a fourth etching process. In the present embodiment, the fourth etching process is a dry etch designed to etch the capping layer 216. In one embodiment, the dry etching process implements a chlorine and HBr containing plasma to etch the capping layer. For example, the etch gas includes Cl2 and HBr. In one particular example, the gas ratio between Cl2 and HBr ranges between about 0.1 and about 0.8. In another example, the fourth etching process further includes a carrier gas N2 with a proper gas flow, such as a N2 gas flow between about 10 sccm and about 300 sccm in one example. In another example, the gas pressure ranges between about 1 mTorr and about 30 mTorr. In yet another example, the bias power ranges between about 10 W and about 300 W. In yet another example, the etching temperature ranges between about 10 C and about 70 C. In yet another example, the etching duration of the fourth etch process ranges between about 1 second and about 100 second.

After the completion of the fourth etching process, the capping layer 216 is patterned such that the edge of the capping layer is offset from the bottom edge of the polysilicon layer, referring to as footing. In one particular example, the edge of the patterned capping layer is substantially aligned with the top edge of the polysilicon or the edge of the hard mask 222. As illustrated in FIG. 6, the footing of the capping layer 216 has an dimension H1 along the gate length direction.

The method 100 includes patterning the gate dielectric. In the present embodiment, the gate dielectric includes the interfacial layer 212 and the high k dielectric material layer 214. Referring to FIG. 7, the method 100 proceeds to step 114 to pattern the gate dielectric layer by applying a fifth etching process. In the present embodiment, the fifth etching process is a dry etch designed to etch the gate dielectric including the high k dielectric material and the interfacial layer. In one embodiment, the dry etching process implements a chlorine containing plasma to etch the gate dielectric. In the present embodiment, the dry etch of the fifth etching process utilizes an etch precursor including Cl2 and BCl3. In one particular example, the gas pressure ranges between about 0.2 mTorr and about 30 mTorr. In another example, the etching temperature ranges between about 10 C and about 70 C. After the step 114, the gate dielectric layers is patterned to have footing. For example, the edge of the patterned gate dielectric layers is offset from the bottom edge of the patterned polysilicon layer 220 by a dimension of H2 along the gate length direction, as illustrated in FIG. 7. In one example, the footing dimension H2 ranges between about 3 nm and about 5 nm after the fifth etching process.

In the present embodiment, the footing of the gate dielectric layers is further controlled such that the overlap between the gate electrode and source/drain is tuned for improved device performance. For example, a cleaning process may be applied and followed by another etching process for footing control. It is described with further details below.

The method 100 proceeds to step 116 by applying a cleaning process to remove the byproducts, such as polymeric residues formed on the semiconductor structure 200 during various etching processes. The cleaning process may include wet processing or dry processing. In one example, after the polysilicon/capping etching process(es), polymeric residues are formed on various surfaces including substrate and sidewalls of the patterned polysilicon and the capping layer. In one particular example, the polysilicon etch generates various polymeric residues including chlorine (Cl)-containing polymer, carbon (C)-containing polymer, fluorine (F)-containing polymer, HBr-containing polymer and/or silicon-containing polymer. In another example, the metal etch generates various polymeric residues including titanium (Ti)-containing polymer, chlorine (Cl)-containing polymer and/or HBr-containing polymer.

The byproducts function as an etch mask to prevent further etching to the gate dielectric materials. By applying the cleaning process to the semiconductor structure 200, the unexpected hard mask of the byproducts is removed. The cleaning process may use any proper cleaning solution, such as hydrofluorine (HF), hydrochloric acid-hydrogen peroxide-water mixture (HPM), ammonia-hydrogen peroxide-water mixture (APM) or combinations thereof.

In one embodiment, a diluted HF dipping process applied to effectively remove the polymeric residues. In one example, the diluted HF solution have a concentration as 500:1 representing for 500 part water and 1 part HF. In another embodiment, a HPM solution including hydrochloride (HCl), hydrogen peroxide (H2O2) and water (H2O) is further used afterward. This solution is a standard cleaning chemical and is also referred to as SC2. The SC2 dipping process can effectively clean the semiconductor structure 200 and remove the associated byproduct from the HF dipping. In another embodiment, the diluted HF and diluted HCl may be combined in to one mixed solution. This mixed solution is applied to the semiconductor structure 200 to remove the polymeric residues and other byproducts.

In yet another embodiment, the cleaning process includes an APM (or SC1) solution including ammonium hydroxide (NH4OH) and peroxide (H2O2). In another example, a solution including sulfuric acid (H2SO4) and peroxide (H2O2) may be used at this cleaning process.

Afterward, the method 100 proceeds to step 118 to further etch the gate dielectric layer by applying a sixth etching process. In the present embodiment, the sixth etching process is similar to the fifth etching process but is fine-tuned for footing control. In one embodiment, the sixth etching process includes a dry etching process with a chlorine containing plasma. In furtherance of the present embodiment, the dry etch of the sixth etching process utilizes an etch precursor including Cl2 and BCl3. In one particular example, the sixth etching process includes a gas pressure ranging between about 0.2 mTorr and about 30 mTorr, and an etching temperature ranging between about 10 C and about 70 C. The etching duration of the sixth etching process is tuned for proper etching effect and footing control. In the present example, the etching duration ranges between about 1 second and about 200 second. After the sixth etching process, the footing dimension H2 is reduced to a range between about 0.5 nm and about 2.5 nm according to one embodiment.

Thus formed semiconductor structure 200 includes a footing structure. Particularly, the footing structure includes a first footing feature of the capping layer 216 and a second footing feature of the gate dielectric (the high k dielectric material layer 214 and the interfacial layer 212). The first footing feature has a first dimension H1 along the gate length direction and the second footing feature has a second dimension H2 along the gate length direction.

Other steps may be implemented before, during or after the method 100. For example, the patterned mask 222 is removed after the method 100. In the present example, the etching process applied to remove the patterned mask 222 include HF and phosphoric acid in two respective etch steps. In another embodiment, a method to form a metal gate stack by a gate replacement process is further provided.

Figure 8:
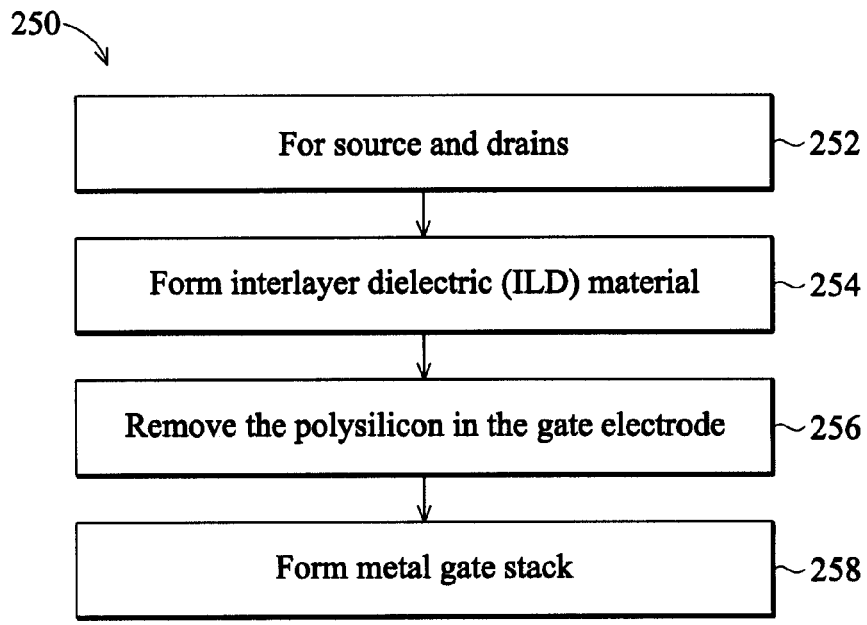
FIG. 8 is a flowchart of a method for making a semiconductor device having a metal gate stack in one embodiment constructed according to various aspects of the present disclosure.
Figure 9:
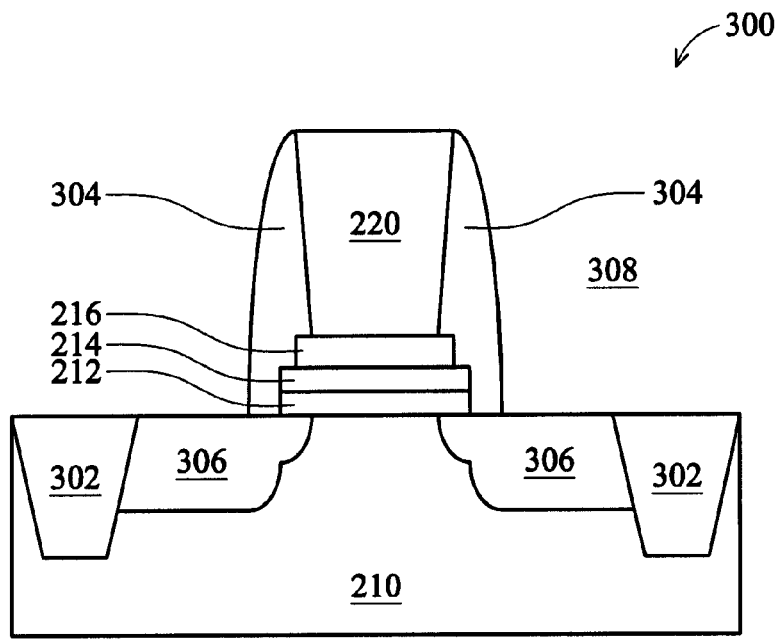
FIGS. 9-12 are sectional views of a semiconductor device having a metal gate stack at various fabrication stages constructed according to various aspects of the present disclosure in one or more embodiments.

FIG. 8 is a flowchart of one embodiment of a method 250 forming a metal gate stack on a semiconductor structure 300 constructed according to aspects of the present disclosure. In one embodiment, the semiconductor structure 300 is same to the semiconductor structure 200. In another embodiment, the method 250 is the continuation of the method 200 to form a metal gate stack. FIGS. 9 and 12 are sectional views of one embodiment of a semiconductor structure 300 having a metal gate stack at various fabrication stages. The semiconductor structure 300 and the method 250 of making the same are collectively described with reference to FIGS. 8 through 12.

Referring to FIG. 9, the method 250 includes a step 252 to form source and drain in the substrate. In the present embodiment, the semiconductor structure 300 is same to the semiconductor structure 200 but two isolation features 302, such as STI features, are explicitly illustrated as being formed in the substrate 210 and defining an active region therebetween. At step 252, a gate spacer 304 is formed on the sidewall of the gate stack. The source and drain 306 are formed on the substrate 210 and interposed by the gate stack.

The gate spacer 304 includes one or more dielectric material, such as silicon oxide, silicon nitride, silicon oxynitride or combinations thereof. In one embodiment, the gate spacer 304 includes a seal spacer disposed on the sidewall of the gate stack and a main spacer disposed on the seal spacer formed respectively by a procedure including deposition and etch.

The source and drain 306 include doped doping species introduced to the semiconductor substrate 210 by a proper technique, such as ion implantation. In one embodiment, the gate stack is configured in the active region for a n-type field effect transistor (nFET), the dopant of the source and drain is n-type dopant, such as phosphorus or arsenic. In another embodiment, the gate stack is configured in the active region for a p-type field effect transistor (pFET), the dopant of the source and drain is p-type dopant, such as boron or gallium. In yet another embodiment, the source and drain 306 include light doped drain (LDD) features and heavily doped source drain (S/D) features, collectively referred to as source and drain. The LDD features and S/D features are formed respectively ion implantation. In the present embodiment, the LDD is implanted after the formation of the seal spacer to prevent the IL re-growth. One or more thermal annealing process is followed to activate the doped species. The diffusion of the source and drain occurs during the thermal annealing process.

In yet another silicide features may be further formed on the source and drain regions to reduce the contact resistance. The silicide features may be formed by a technique referred to as self-aligned silicide (salicide) including metal deposition (such as nickel deposition) onto a silicon substrate, a thermal anneal to react the metal with silicon to form silicide, and an etch to removed un-reacted metal.

In another embodiment, the source and drain region may include epi grown semiconductor material for proper strain effect, leading to enhanced carrier mobility in the channel. In one embodiment, silicon germanium is epi. grown in the source and region for a pFET. In another embodiment, silicon carbide is epi. grown in the source and region for a nFET. The method to form the strained structure includes etching to form recesses in the substrate and epi growth to form crystalline a semiconductor material in the recesses.

Figure 10:
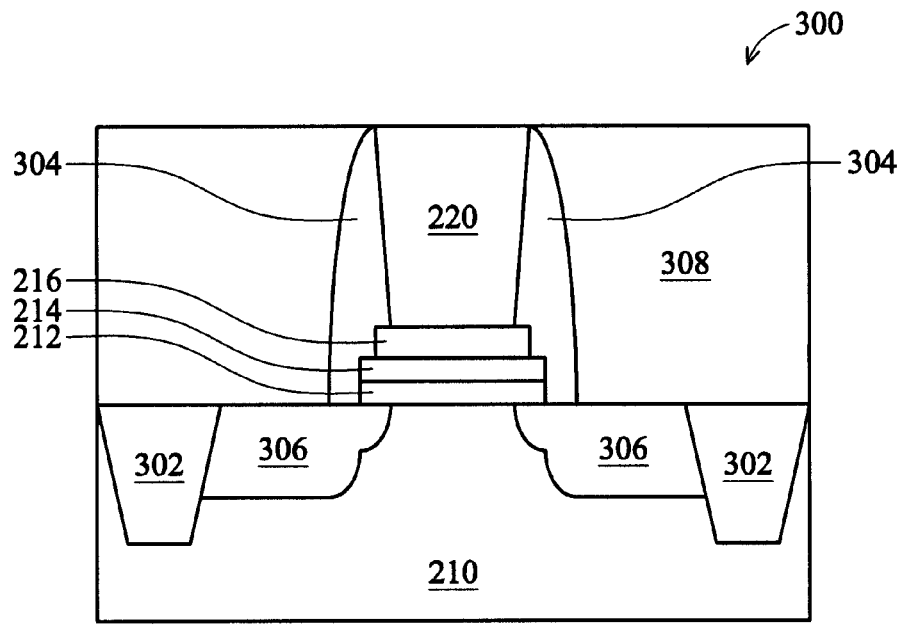

Referring to FIG. 10, the method 250 proceeds to step 254 by forming an interlayer dielectric (ILD) 308 on the substrate and the gate stack. The ILD 308 is deposited by a proper technique, such as CVD. The ILD 308 includes a dielectric material, such as silicon oxide, low k dielectric material or a combination. Then a chemical mechanical polishing (CMP) process may be applied thereafter to polarize the surface of the ILD 308. In one example, the gate stack is exposed by the CMP process for the subsequent processing steps. In another example that the hard mask 222 is not removed at the previous step, the CMP removes the hard mask 222 as well. Alternatively the CMP stops on the hard mask 222 and the hard mask 222 is removed thereafter by an etch process.

The polysilicon layer is then replaced by one or more metal material to form a metal gate. The corresponding process is referred to as a gate-last process and the thus formed circuit is referred to as a gate-last scheme.

Figure 11:
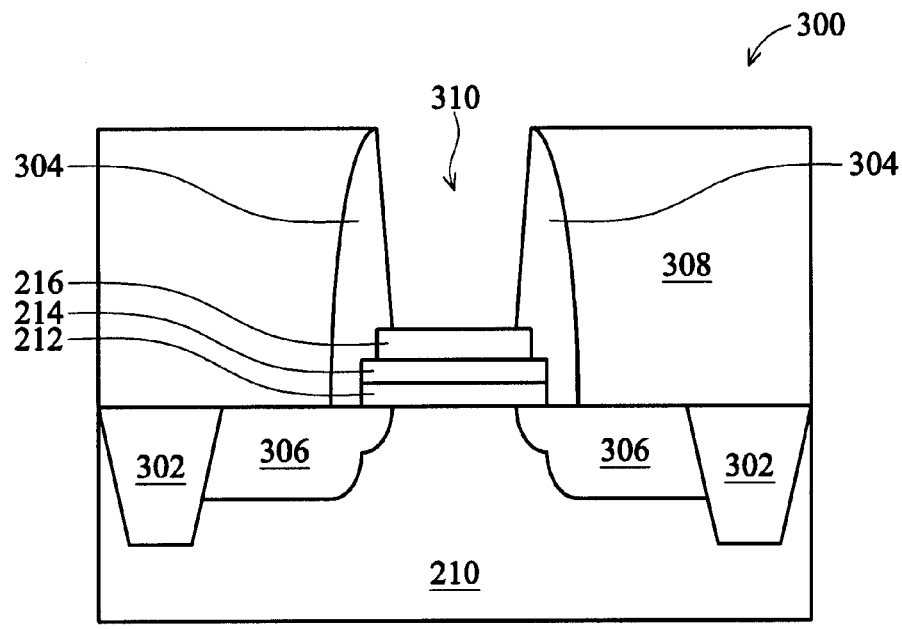
Figure 12:
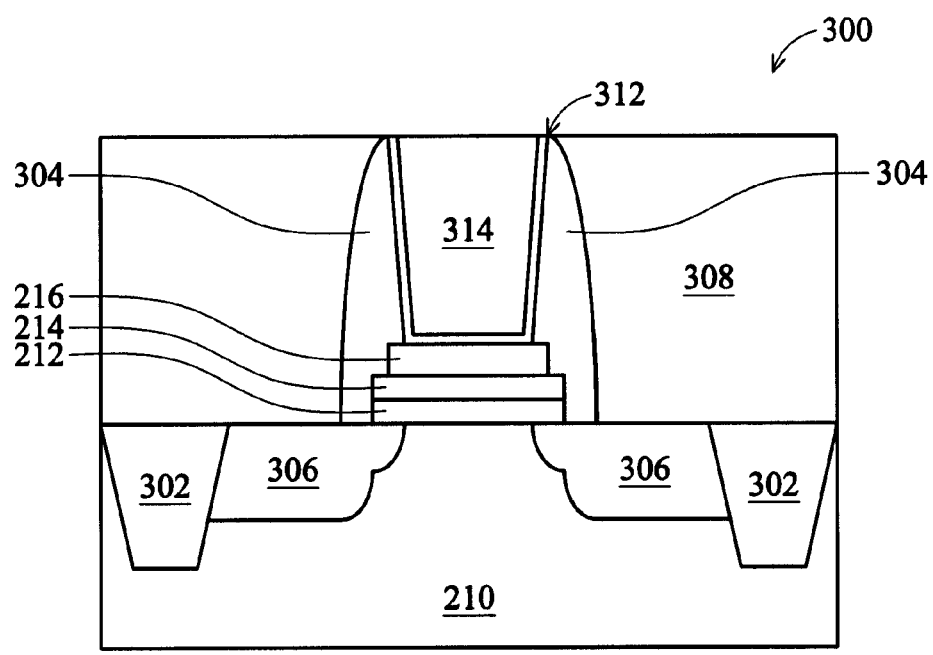

Referring to FIG. 11, the method 250 proceeds to step 256 by removing the polysilicon layer 220 in the gate stack, resulting a gate trench 310. The polysilicon is removed by a suitable etching process, such as wet etch.

Referring to FIG. 12, the method 250 proceeds to step 258 by filling one or more metal materials in the gate trench 310, forming a metal gate stack. In the present embodiment, a first metal 312 having a proper work function is deposited in the gate stack 310 and a second metal 314 is disposed on the first metal and fills in the gate trench 310. The first metal is also referred to as work function metal.

More specifically, for a nFET, the first metal 312 has a work function substantially equals to or less than about 4.2 eV, referred to as n metal. For a nFET, the first metal 312 has a work function substantially equals to or greater than about 5.2 eV, referred to as p metal. In one example, the n metal includes tantalum or titanium aluminum. In another example, the p metal includes titanium nitride or tantalum nitride. The work function metal is deposited by a suitable technique. In the present embodiment, the work function metal is deposited by PVD.

In various embodiments, the second metal 314 includes aluminum, tungsten or other suitable metal. The second metal 314 is deposited by a suitable technique, such as PVD or plating. In another embodiment, a CMP process is applied to remove the excessive metals, such as the metals disposed on the ILD 308. Thus formed metal layers (312 and 314) also has an reentrant structure wherein the sidewall of the metal layers 312 and 314 includes an angle to the substrate top surface. The angle ranges between 85 degree and 90 degree.

Other processing steps may follow to form a functional circuit. For example, an interconnect structure is formed on the substrate and is designed to couple various transistors and other devices to form a functional circuit. The interconnect structure includes various conductive features, such as metal lines for horizontal connections and contacts/vias for vertical connections. The various interconnect features may implement various conductive materials including copper, tungsten and silicide. In one example, a damascene process is used to form copper-based multilayer interconnect structure. In another embodiment, tungsten is used to form tungsten plug in the contact holes.

Various advantages may present in one or more embodiments of the method 100, the semiconductor structure 200, the method 250, and the semiconductor structure 300. In one embodiment, the footing of the metal gate stack is tuned by etch and cleaning. Such tuned footing of the metal gate stack, such as the footing of the capping layer and the footing of the gate dielectric, the LDD overlap with gate electrode is achieved and controlled for charge accumulation and resistance reduction. Accordingly, the device performance is improved.

In another embodiment, a reentrant gate structure has a sidewall with an angle to the substrate ranging between 85 degree and 90 is achieved in the disclosed structure and method. Thereby, the deposition/filling of the work function metal is improved. Particularly, the uniformity of the work function metal is improved. The uniformity of the work function metal is defined as the ratio between the work function metal thickness at gate edge and the work function metal thickness at gate center.

In another embodiment, with the gate footing and the reentrant gate profile, the above resistance reduction is achieved while the seal spacer present. Therefore, the seal spacer is kept without thinning to effectively suppress the interfacial layer re-growth. In yet another embodiment, the failure of the breakdown voltage is solved by forming the footing structure in the input/output (I/O) area. The disclosed footing (footing of the high k dielectric material and the footing of the capping layer) can protect the I/O gate dielectric from the damage issue by the implantation.

The semiconductor structure 200 (or 300) serves only as one example of a device within which various aspects of the method 100 (or 250) may be implemented. The semiconductor structure 200 (or 300) and the method 100 (or 250) of making the same may be used in other semiconductor devices having a high k and metal gate features, such as strained semiconductor substrate, a hetero-semiconductor device or a stress-free isolation structure.

The present disclosure is not limited to applications in which the semiconductor structure includes a filed effect transistor, such as a metal-oxide-silicon (MOS) transistor, and may be extended to other integrated circuit having a metal gate stack. For example, the semiconductor structure 200 (or 300) may include a dynamic random access memory (DRAM) cell, a single electron transistor (SET), and/or other microelectronic devices (collectively referred to herein as microelectronic devices). In another embodiment, the semiconductor structure 200 includes FinFET transistors. Of course, aspects of the present disclosure are also applicable and/or readily adaptable to other type of transistor, including single-gate transistors, double-gate transistors and other multiple-gate transistors, and may be employed in many different applications, including sensor cells, memory cells, logic cells, and others.

Although embodiments of the present disclosure have been described in detail, those skilled in the art should understand that they may make various changes, substitutions and alterations herein without departing from the spirit and scope of the present disclosure. In one embodiment, the gate electrode may alternatively or additionally include other suitable metal. The footing procedure may implement other effective cleaning procedure. The disclosed method is used to but not limited to form one transistor, such as an n-type metal-oxide-semiconductor field-effect-transistor (nMOSFET). For example, a plurality of nMOSFETs and a plurality of p-type metal-oxide-semiconductor field-effect-transistors (pMOSFETs) are formed in the same substrate, the nMOSFETs and pMOSFETs are formed in a collective procedure where some features are respectively formed. In a particular example, the n metal is formed in the nMOSFET regions while pMOSFET regions are covered from the deposition of n metal.

In another embodiment, the semiconductor substrate may include an epitaxial layer. For example, the substrate may have an epitaxial layer overlying a bulk semiconductor. Furthermore, the substrate may include a semiconductor-on-insulator (SOI) structure such as a buried dielectric layer. Alternatively, the substrate may include a buried dielectric layer such as a buried oxide (BOX) layer, such as that formed by a method referred to as separation by implantation of oxygen (SIMOX) technology, wafer bonding, selective epitaxial growth (SEG), or other proper method.

Thus, the present disclosure provides a semiconductor structure. The semiconductor structure includes a semiconductor substrate; and a gate stack disposed on the semiconductor substrate. The gate stack includes a high k dielectric material layer, a capping layer disposed on the high k dielectric material layer, and a metal layer disposed on the capping layer. The capping layer and the high k dielectric material layer have a footing structure.

In one embodiment, the footing structure includes a portion of the high k dielectric material layer horizontally extends from a bottom edge of the metal layer. In another embodiment, the footing structure includes a portion of the capping layer horizontally extends from a bottom edge of the metal layer. In yet another embodiment, the footing structure has a horizontal dimension ranging between about 0.5 nm and about 2.5 nm along a gate length direction of the gate stack.

In another embodiment, the metal layer includes a work function metal film disposed on the capping layer; and another metal film on the work function metal film. In yet another embodiment, the capping layer includes titanium nitride. In yet another embodiment, the semiconductor structure further includes an interfacial layer disposed between the semiconductor substrate and the high k dielectric material layer.

In another embodiment, the metal layer includes an reentrant sidewall profile. In furtherance of the embodiment, the sidewall of the metal layer has an angle to a top surface of the semiconductor substrate, and the angle ranges between about 85 degree and about 90 degree.

The present disclosure also provides a semiconductor structure in another embodiment. The semiconductor structure includes a semiconductor substrate; and a gate stack disposed on the semiconductor substrate. The gate stack includes a gate dielectric layer including a high k dielectric material, a capping layer disposed on the high k dielectric material layer, and a metal layer disposed on the capping layer. The metal layer has an reentrant sidewall profile.

In one embodiment, the semiconductor substrate has a top surface wherein the gate stack disposed on; and the metal layer has a sidewall tilted to the top surface of the semiconductor substrate with an angle being less than about 90 degree. In another embodiment, the angle is greater than about 85 degree.

In another embodiment, the gate dielectric layer and the capping layer includes a footing feature. In another embodiment, the footing feature has a dimension along a gate length direction, wherein the dimension ranges between about 0.5 nm and about 2.5 nm.

In yet another embodiment, the gate dielectric layer further includes an interfacial material layer; and the capping layer includes titanium nitride. In yet another embodiment, the metal layer includes a work function metal film disposed on the capping layer; and another metal film disposed on the work function metal film.

The present disclosure also provides a method of forming a gate stack. The method includes forming various gate material layers on a semiconductor substrate, wherein the gate material layers includes a gate dielectric layer, a capping layer on the gate dielectric layer and a polysilicon layer on the capping layer; performing a first dry etch to pattern the polysilicon layer using a first etchant; performing a second dry etch to control sidewall of the patterned polysilicon layer such that the sidewall of the patterned polisilicon layer is reentrant using a second etchant different from the first etchant; performing a third dry etch to pattern the capping layer such that the capping layer includes a first footing feature; and performing a fourth dry etch to pattern the gate dielectric layer such that the capping layer includes a second footing feature.

In one embodiment of the method, the first etchant includes Cl2 and CF4; and the second etchant includes HBr. In another embodiment, the first dry etch further includes a first etch step tuned to effectively etch silicon oxide and a second etch step tuned to avoid damaging the capping layer.

In yet another embodiment, the third dry etch utilizes a third etchant including Cl2 and HBr; and the fourth dry etch utilizes a fourth etchant including Cl2 and BCl3. In yet another embodiment, the fourth etch includes a first etch step using the fourth etchant; therefore a cleaning process; and therefore a second etch step using the fourth etchant to control the second footing feature.

In another embodiment, the method further includes replacing the polysilicon layer with a metal layer including a work function metal.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:
    a semiconductor substrate; and
    a gate stack disposed on the semiconductor substrate, wherein the gate stack includes:
        a high k dielectric material layer,
        a capping layer disposed on the high k dielectric material layer, and
        a metal layer disposed on the capping layer, wherein a top surface of the metal layer includes a first width dimension, and wherein an opposing bottom surface of the metal layer includes a second width dimension less than the first width dimension,
        wherein the capping layer and the high k dielectric material layer have a footing structure, wherein the capping layer of the footing structure includes a third width dimension greater than the second width dimension, and wherein the high k dielectric material layer of the footing structure includes a fourth width dimension greater than the third width dimension.

2. The semiconductor structure of claim 1, wherein the footing structure has a horizontal dimension ranging between about 0.5 nm and about 2.5 nm along a gate length direction of the gate stack.

3. The semiconductor structure of claim 1, wherein the metal layer includes:
    a work function metal film disposed on the capping layer; and
    another metal film on the work function metal film.

4. The semiconductor structure of claim 1, wherein the capping layer includes titanium nitride.

5. The semiconductor structure of claim 1, further comprising an interfacial layer disposed between the semiconductor substrate and the high k dielectric material layer.

6. The semiconductor structure of claim 1, wherein the metal layer includes a reentrant sidewall profile.

7. The semiconductor structure of claim 6, wherein the sidewall of the metal layer has an angle to a top surface of the semiconductor substrate, and the angle ranges between about 85 degrees and about 90 degrees.

8. A semiconductor structure, comprising:
    a semiconductor substrate; and
    a gate stack disposed on the semiconductor substrate, wherein the gate stack includes:
        a gate dielectric layer including a high k dielectric material layer, wherein a top surface of the gate dielectric layer includes a first width dimension,
        a capping layer disposed on the high k dielectric material layer, wherein a top surface of the capping layer includes a second width dimension less than the first width dimension,
        a metal layer disposed on the capping layer, wherein the metal layer has a reentrant sidewall profile, and wherein a bottom surface of the metal layer includes a third width dimension less than the second width dimension,
        an interfacial layer interposed between the gate dielectric layer and the semiconductor substrate, and
        gate spacers formed on sidewalls of the metal layer and on the top surface of the capping layer and on the top surface of the gate dielectric layer without being formed on a top surface of the interfacial layer.

9. The semiconductor structure of claim 8, wherein:
    the semiconductor substrate has a top surface wherein the gate stack is disposed on; and
    the metal layer has a sidewall tilted to the top surface of the semiconductor substrate with an angle being less than about 90 degrees.

10. The semiconductor structure of claim 9, wherein the angle is greater than about 85 degrees.

11. The semiconductor structure of claim 8, wherein the gate dielectric layer and the capping layer includes a footing feature.

12. The semiconductor structure of claim 11, wherein the footing feature has a dimension along a gate length direction, wherein the dimension ranges between about 0.5 nm and about 2.5 nm.

13. The semiconductor structure of claim 8, wherein the capping layer includes titanium nitride.

14. The semiconductor structure of claim 8, wherein the metal layer includes:
    a work function metal film disposed on the capping layer; and another metal film disposed on the work function metal film.

15. A semiconductor device comprising:
    a semiconductor substrate;
    a gate dielectric layer disposed on the semiconductor substrate, wherein a top surface of the gate dielectric layer includes a first dimension,
    a capping layer disposed on the gate dielectric layer, wherein a top surface of the capping layer includes a second dimension less than the first dimension, and
    a gate metal layer disposed on the capping layer, wherein a bottom surface of the gate metal layer includes a third dimension less than the second dimension, and wherein a top surface of the gate metal layer includes a fourth dimension greater than the third dimension;
    an interfacial layer interposed between the gate dielectric layer and the semiconductor substrate; and
    gate spacers formed on sidewalls of the gate metal layer and on the top surface of the capping layer and on the top surface of the gate dielectric layer without being formed on a top surface of the interfacial layer.

16. The semiconductor device of claim 15, wherein the gate metal layer includes a work function metal film disposed on the capping layer and another metal film disposed on the work function metal film, wherein the work function metal film is in physical contact with the top surface of the capping layer and the gate spacers.

* * * * *